US009577196B2

United States Patent
Kim et al.

(10) Patent No.: US 9,577,196 B2
(45) Date of Patent: Feb. 21, 2017

(54) OPTOELECTRONICS INTEGRATION BY TRANSFER PROCESS

(71) Applicant: INTERNATIONAL BUSINESS MACHINES CORPORATION, Armonk, NY (US)

(72) Inventors: Jeehwan Kim, White Plains, NY (US); Ning Li, White Plains, NY (US); Devendra K. Sadana, Pleasantville, NY (US); Tze-bin Song, Los Angeles, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 129 days.

(21) Appl. No.: 14/193,930

(22) Filed: Feb. 28, 2014

(65) Prior Publication Data

US 2015/0249212 A1 Sep. 3, 2015

(51) Int. Cl.
*H01L 51/00* (2006.01)
*H01L 51/52* (2006.01)
*H01L 51/50* (2006.01)

(52) U.S. Cl.
CPC ......... *H01L 51/003* (2013.01); *H01L 51/0024* (2013.01); *H01L 51/0037* (2013.01); *H01L 51/5092* (2013.01); *H01L 51/5212* (2013.01); *H01L 51/5215* (2013.01); *H01L 51/5231* (2013.01); *H01L 51/5234* (2013.01)

(58) Field of Classification Search
CPC .................................................. H01L 251/003
See application file for complete search history.

(56) References Cited

U.S. PATENT DOCUMENTS

| | | | |
|---|---|---|---|
| 4,988,674 A | 1/1991 | Mir et al. | |
| 6,468,841 B2 | 10/2002 | Muramatsu et al. | |
| 6,690,109 B2 | 2/2004 | Tada | |
| 6,878,643 B2 | 4/2005 | Krulevitch et al. | |
| 6,991,963 B2 | 1/2006 | Krulevitch et al. | |
| 7,030,411 B2 | 4/2006 | Krulevitch et al. | |
| 7,259,106 B2 | 8/2007 | Jain | |
| 7,414,313 B2 | 8/2008 | Majumdar et al. | |
| 7,967,936 B2 | 6/2011 | Agarwal et al. | |
| 8,241,467 B2 | 8/2012 | Raychaudhuri et al. | |

(Continued)

OTHER PUBLICATIONS

Yim, Y., et al. "Solution-Processed Flexible ITO-Free Organic Light-Emitting Diodes Using Patterned Polymetric Anodes" Journal of Display Technology, Vol. 6, Issue 7. Jul. 2010. pp. 252-256.

*Primary Examiner* — Abul Kalam
(74) *Attorney, Agent, or Firm* — Tutunjian & Bitetto, P.C.; Louis J. Percello

(57) ABSTRACT

A method for fabricating an optoelectronic device includes forming an adhesion layer on a substrate, forming a material layer on the adhesion layer and applying release tape to the material layer. The substrate is removed at the adhesion layer by mechanically yielding the adhesion layer. A conductive layer is applied to the material layer on a side opposite the release tape to form a transfer substrate. The transfer substrate is transferred to a target substrate to join the target substrate to the conductive layer of the transfer substrate. The release tape is removed from the material layer to form a top emission optoelectronic device.

12 Claims, 3 Drawing Sheets

(56) References Cited

U.S. PATENT DOCUMENTS

| | | | |
|---|---|---|---|
| 8,637,859 B2* | 1/2014 | Pschenitzka | H01L 31/0232 |
| | | | 257/40 |
| 9,076,988 B2* | 7/2015 | Pschenitzka | H01L 31/0232 |
| 9,099,664 B2* | 8/2015 | Fogel | H01L 51/442 |
| 9,105,854 B2* | 8/2015 | Fogel | H01L 51/442 |
| 2003/0190768 A1 | 10/2003 | Lu et al. | |
| 2007/0017568 A1* | 1/2007 | Berke | B82Y 10/00 |
| | | | 136/252 |
| 2008/0264682 A1 | 10/2008 | Catron et al. | |
| 2010/0102294 A1 | 4/2010 | Jou et al. | |
| 2011/0095271 A1 | 4/2011 | Bradley et al. | |
| 2012/0103660 A1* | 5/2012 | Gupta | H01L 51/0021 |
| | | | 174/126.2 |
| 2012/0104374 A1 | 5/2012 | Allemand | |
| 2012/0107600 A1 | 5/2012 | Zou | |
| 2013/0105203 A1* | 5/2013 | Lee | H01L 51/003 |
| | | | 174/254 |
| 2013/0157446 A1* | 6/2013 | Lifka | H01L 51/0022 |
| | | | 438/479 |
| 2015/0014642 A1* | 1/2015 | Kwon | H01L 51/0013 |
| | | | 257/40 |
| 2015/0083224 A1* | 3/2015 | Fogel | H01L 51/442 |
| | | | 136/263 |
| 2015/0084074 A1* | 3/2015 | Bayram | C30B 25/18 |
| | | | 257/94 |

* cited by examiner

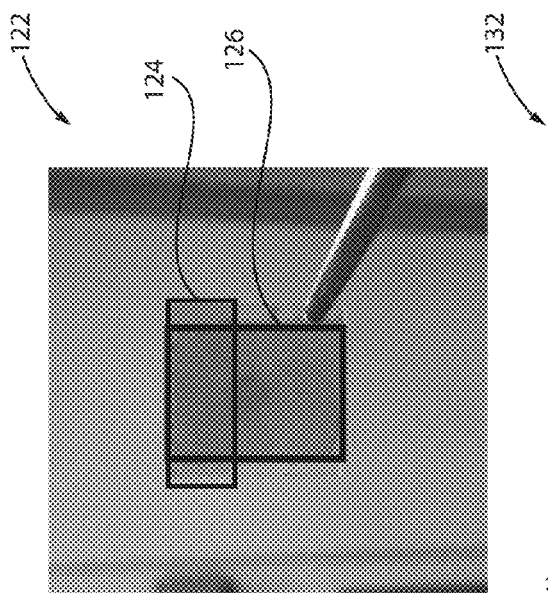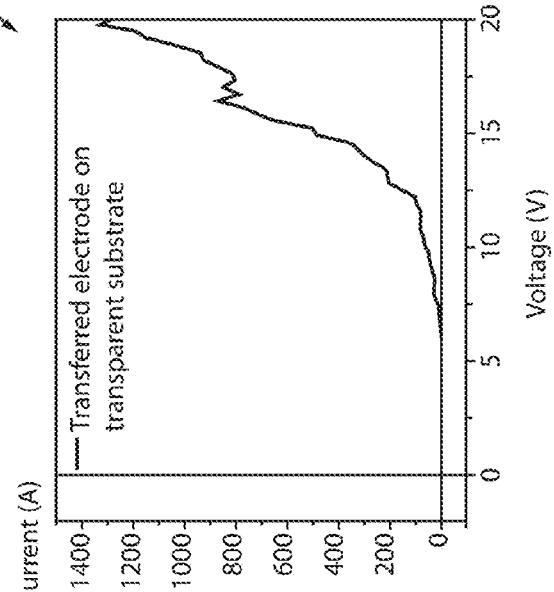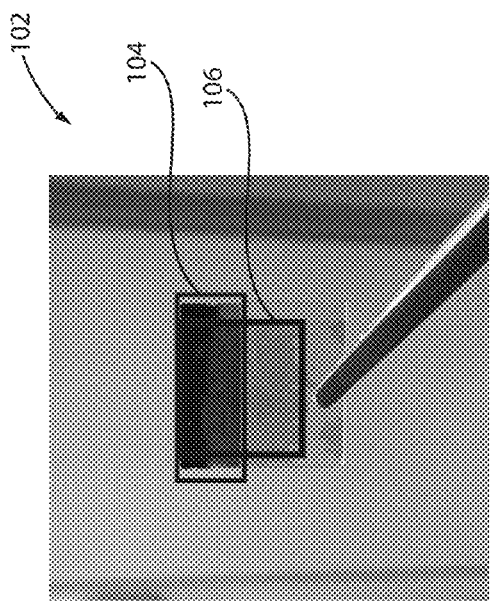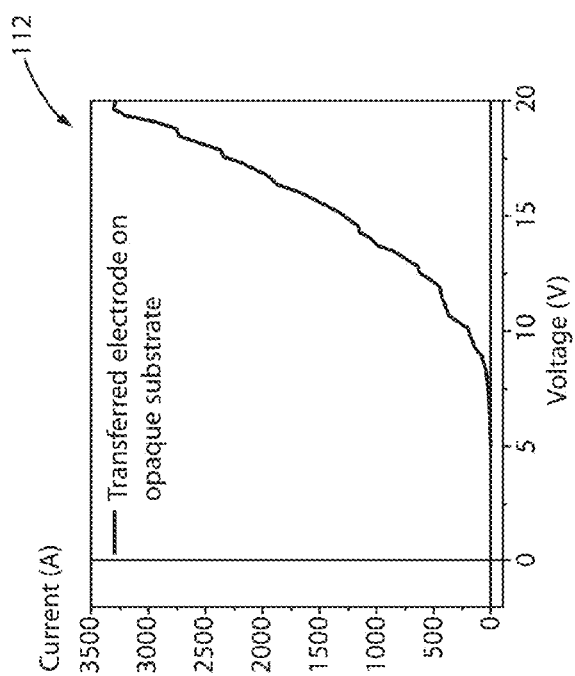
FIG. 10A
FIG. 10B

OPTOELECTRONICS INTEGRATION BY TRANSFER PROCESS

BACKGROUND

Technical Field

The present invention relates to semiconductor processing, and more particularly to fabricating light emitting diodes using a transfer process to reduce processing time, increase transmissibility and improve performance.

Description of the Related Art

Top emission organic light emitting diodes (OLED) are typically fabricated with a top electrode formed using a vacuum process. Top emission OLEDs with a high transmission top electrode for light out-coupling are difficult to fabricate since the vacuum processes often lead to surface damage on the top electrode. This surface damage has an impact on the transmissibility of the top electrode. In addition, vacuum processes tend to be time consuming, which increases expense. Further, since vacuum processes provide materials on bottom or underlying layers, the type of materials selected are limited due to material compatibility issues.

Examples of vacuum processes described below suffer from additional drawbacks. For example, sputtering deposition can significantly damage the underlying layer or layers on which the sputtered material is formed. Humidity during an atomic layer deposition (ALD) process can lead to a degradation in the properties of existing layers. Chemical deposition processes can cause additional unwanted reactions with the existing layers. Evaporation processes take a long time to introduce a multilayer structure, and also reduce the transmission for transparent conducting electrodes.

Even solution processes top electrodes, such as, solution processed transparent conductive oxides (TCO) can degrade the transmissibility of the top electrode. Such processes also require high temperature annealing, which limits the material alternatives for the bottom layers, to achieve good conductivity.

SUMMARY

A method for fabricating an optoelectronic device includes forming an adhesion layer on a substrate, forming a material layer on the adhesion layer and applying release tape to the material layer. The substrate is removed at the adhesion layer by mechanically yielding the adhesion layer. A conductive layer is applied to the material layer on a side opposite the release tape to form a transfer substrate. The transfer substrate is transferred to a target substrate to join the target substrate to the conductive layer of the transfer substrate. The release tape is removed from the material layer to form a top emission optoelectronic device.

A method for fabricating an optoelectronic device includes forming an adhesion layer on a substrate, forming a transparent conductor on the adhesion layer, applying release tape to the transparent conductor, removing the substrate at the adhesion layer by mechanically yielding the adhesion layer, applying an organic conductive layer to the material layer on a side opposite the release tape to form a transfer substrate, forming a target substrate independently of the transfer substrate, the target substrate including light emitting layers a bottom electrode, transferring the transfer substrate to a target substrate to join the light emitting layers of the target substrate to the organic conductive layer of the transfer substrate and removing the release tape from the material layer to form a top emission organic light emitting diode (OLED).

A photoelectronic device includes an organic conductive material and a first transparent conductor layer formed on the organic conductive layer to form a top electrode. Light emitting layers are molecularly bonded to the organic conductive material after a transfer process such that an interface between the top electrode and the light emitting layers is free from damage due to exposure to vacuum formation processes.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 10A is an image of a photoelectronic device having an opaque bottom electrode and a transparent top electrode and a characteristic graph of current versus voltage for the photoelectronic device in accordance with one illustrative embodiment;

FIG. 10B is an image of a photoelectronic device having a transparent bottom electrode and a transparent top electrode and a characteristic graph of current versus voltage for the photoelectronic device in accordance with another illustrative embodiment.

DETAILED DESCRIPTION OF PREFERRED EMBODIMENTS

Figure 1:
FIG. 1 is a cross-sectional view of a wafer or substrate having an adhesion layer formed thereon in accordance with the present principles.

In accordance with the present principles, methods and devices are provided that improve manufacturability and performance of electronic devices, and in particular top electrode light emission devices. In accordance with the present embodiments, a top electrode is protected from the significant damage by the elimination of a vacuum process for its integration in the device. Reduced damage provides a higher transmission top electrode. In addition, due to the processing features, a greater number of material selection options are available for substrate and underlying layer materials. This includes the use of different transparent conductors and/or opaque substrates. Multiple/stacking structures and complicated layers can be manufactured without damage to underlying structures or devices. By employing wafer transfer (soft) processing, the fabrication time of the top electrodes is reduced over the fabrication times needed by vacuum methods.

It is to be understood that the present principles will be described in terms of a given illustrative architecture having described wafers or substrates; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or individual components, in accordance with the present principles, may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips or individual components. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. The present embodiments may be employed in or with photovoltaic devices, photo sensors, photodiodes or other optoelectronic components or circuits.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B". "A and/or B" and "at least one of A and B", is intended to encompass the selection of the first listed option (A) only, or the selection of the second listed option (B) only, or the selection of both options (A and B). As a further example, in the cases of "A. B, and/or C" and "at least one of A. B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a substrate or wafer 20 is provided on which a weak adhesion layer 22 is deposited. The substrate 20 may include any suitable substrate material and preferably includes monocrystalline Si, although other substrate materials such as III-V materials (e.g., GaAs, GaN, GaP, InP, etc.), Ge, SiGe, SiC, ceramics, plastics, glass, or other smooth materials with low adhesive properties when employed with the weak adhesion layer 22.

The weak adhesion layer 22 includes a lowest adhesion energy of a stack of materials that will be formed on the weak adhesion layer 22. The weak adhesion layer 22 may include a metal, such as gold, silver, copper, and metals of light and heavy platinum metal triad of elements (e.g., light: ruthenium, rhodium, palladium; heavy: osmium, iridium, platinum), graphene, carbon nanotubes, etc. In a particularly useful embodiment, weak adhesion layer 22 includes gold having a thickness of between 5 nm and 20 nm, and more preferably about 10 nm.

The weak adhesion layer 22 materials provide poor adhesion with the substrate 20 and are preferably thermally stable for a transferring temperature, e.g., between about 80 to 120° C. and preferably around 100° C. Other temperatures may also be employed, but lower temperatures are preferred.

Figure 2:
FIG. 2 is a cross-sectional view of the wafer or substrate of FIG. 1 having a material layer or device structure layer formed thereon in accordance with the present principles.

Referring to FIG. 2, a material layer 24 is applied over the weak adhesion layer 22. The material layer 24 may include any material useful for the formation of a photoelectronic device. The material layer 24 may include a layer patterned for the formation of device structures, may include an active layer employed in the overall device structure and/or may include a transparent conductor (TC) including, e.g., a transparent conductive oxide (TCO), etc. In a particularly useful embodiment, the material layer 24 includes a TC applied on top of the weak adhesion layer 22. The application of the material layer 24 may be provided by an epitaxially grown layer or may be adhered to a surface of the weak adhesion layer 22 by a wafer transfer process.

In one embodiment, the material layer 24 will be employed as a top electrode layer for a light emitting diode and may include a transparent conductor. The transparent conductor may include tin oxide, zinc oxide, titanium oxide, aluminum-doped zinc oxide, indium doped zinc oxide, fluorine doped tin oxide, tin doped indium oxide, antimony doped tin oxide, indium tin oxide, etc. In addition, a composite metal oxide film with or without carbon nanotubes, graphene, metallic nanowires or a metallic grid may also be formed on the material layer 24.

Material layer 24 may include a multilayer structure or device structure on top of the weak adhesion layer 22 or may include a TC layer with one or more additional layers formed thereon. The TC materials employed for layer 24 should have good conductivity, good light transmission, and be thermally stable for a transferring temperature around 100° C. (e.g., 80-120° C.), although other temperatures are contemplated.

Figure 3:
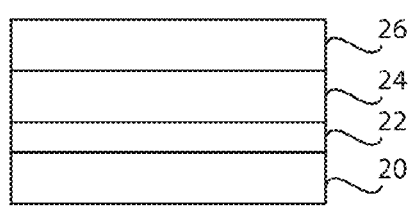
FIG. 3 is a cross-sectional view of the wafer or substrate of FIG. 2 having a thermal release tape attached to the material layer or device structure layer in accordance with the present principles.

Referring to FIG. 3, a thermal release tape 26 or a handle substrate is applied on top of the material layer 24. The thermal release tape 26 is an adhesive tape that adheres securely, but can be peeled off easily with the application of heat.

Figure 4:
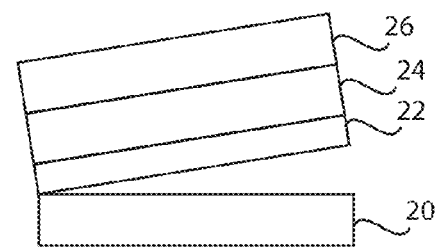
FIG. 4 is a cross-sectional view of the structure of FIG. 3 having the substrate removed by mechanical force in accordance with the present principles.
Figure 5:
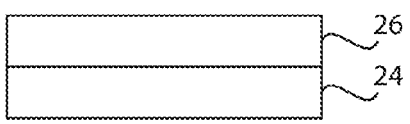
FIG. 5 is a cross-sectional view of the structure of FIG. 4 having the adhesion layer removed in accordance with the present principles.

Referring to FIG. 4, the thermal release tape 26 is mechanically peeled off to split the whole structure to remove the substrate or wafer 20. The split occurs at the weak adhesion layer 22. The weak adhesion layer 22 is now exposed and can be further processed. For example, the weak adhesion layer 22 may be etched, textured, patterned, etc. or removed as depicted in FIG. 5. In one embodiment, if the weak adhesion layer 22 includes gold, and a gold etchant is optionally employed to clean the surface or to remove the gold completely.

Figure 6:
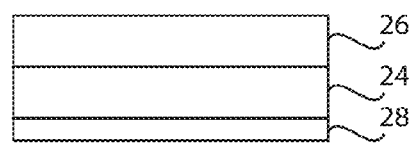
FIG. 6 is a cross-sectional view of the structure of FIG. 5 showing a conductive layer (organic) formed on the material or device structure layer to form a transfer substrate in accordance with the present principles.

Referring to FIG. 6, the layers 24 and 26 have a transparent conductor layer 28 formed thereon. In this embodiment, the weak adhesion layer 22 has been removed from layer 24, e.g., by an etching or polishing process. Layer 24 may include a top electrode as will later be described. The layer(s) 24 may include a transparent conductor (TC) and in particular may include a transparent conductive oxide (TCO), such as zinc oxide, indium tin oxide, etc. The layer or layers 28 may be transferred to layer 24 using. e.g., a wafer transfer process or deposited on layer 24.

The layer 28 may include, e.g., organic materials formed on the transparent conductor 24 or other layer or layers. Since the transparent conductor 24 is formed first, the sensitive material of the layer 28 is not subjected to its processing. The transparent conductor 24 may include indium tin oxide, or other transparent materials as described. Layer 28 may include an organic transparent conductor, such as e.g., PEDOT:PSS or poly(3,4-ethylenedioxythiophene) poly(styrenesulfonate). PEDOT:PSS is a polymer mixture of two ionomers. One component in this mixture is made up of sodium polystyrene sulfonate, which is a sulfonated polystyrene. Part of the sulfonyl groups are deprotonated and carry a negative charge. The other component poly(3,4-ethylenedioxythiophene) or PEDOT is a conjugated polymer and carries positive charge and is based on polythiophene. Together the charged macromolecules form a macromolecular salt, which is used as a transparent, conductive polymer with high ductility. The PEDOT:PSS can form a molecular bond with OLED materials. Other materials are also contemplated.

Figure 7:
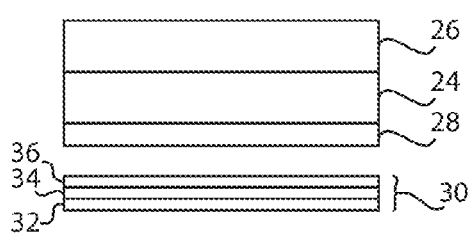
FIG. 7 is a cross-sectional view of the structure of FIG. 6 showing the transfer substrate being joined to a target substrate by a wafer transfer process (soft process) in accordance with the present principles.

Referring to FIG. 7, the layer 28 may include any layer or layers of material that are sensitive to conventional processing, e.g., sensitive to high temperatures, ion bombardment, etc. By transferring a transfer substrate (e.g., the layers 24 and 28) to a target substrate 30, the target substrate 30 is not subjected to the processing of layers 24 and 26, and the layers 24 and 26 are not subjected to the processing of the target substrate 30. In a particularly useful embodiment, the target substrate 30 includes structures for light emission, such as for a light emitting diode (LED), and in particular, an organic LED (OLED). In one example, the target substrate 30 includes a substrate layer 32 having an electron injection layer 34 and a hole generation layer 36 formed thereon. In one embodiment, the substrate layer 32 may include a conductive material such as Al or other metal.

The electron injection layer 34 may include, e.g., organometallic chelates (for example, tris(8-hydroxyquinoline) aluminum ($Alq_3$), fluorescent and phosphorescent dyes and conjugated dendrimers. The hole generation layer 36 may include charge transport materials such as, for example triphenylamine and derivatives, e.g., N,N'-di(naphthalene-1-yl)-N,N'-diphenyl-benzidine (NPB). Fluorescent dyes may also be employed to obtain light emission at different wavelengths, and compounds such as perylene, rubrene and quinacridone derivatives may be employed. $Alq_3$ may be employed as a green emitter, electron transport material and as a host for yellow and red emitting dyes.

It should be noted that while OLED materials and organic heterojunction devices are particularly useful, other LED structures and materials (including inorganic) may be employed for the target substrate and benefit from the present principles.

The conductive organic layer 28 is brought into contact with the target substrate 30 and adhered thereto, e.g., by molecular bonding. The adherence may be achieved through pressure, heat, chemical reaction, adhesive bonding, cold welding, etc. depending on the materials and the application. In one embodiment, the conductive layer 28 may include PEDOT:PSS, and a molecular bond is formed between the layers 28 and 30. Vacuum processing is avoided on the surface of the organic conductive layer 28 to improve device function.

Figure 8:
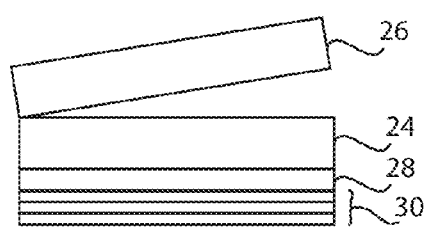
FIG. 8 is a cross-sectional view of the structure of FIG. 7 showing the thermal release tape removed in accordance with the present principles.

Referring to FIG. 8, the thermal release tape 26 is removed by heating the tape 26 to its release temperature to release the tape 26. This leaves the materials or device structures layer 24 exposed. The materials or device structures layer 24 may include TCO and may be etched or otherwise cleaned to provide a pristine anode or top electrode surface.

Figure 9:
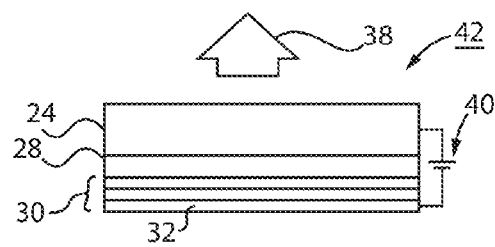
FIG. 9 is a cross-sectional view of the structure of FIG. 8 showing a photoelectronic device (e.g., light emitting diode) in accordance with the present principles.

Referring to FIG. 9, an OLED 42 is composed of layers of organic materials situated between two electrodes 24, 32 (the anode and cathode). A highest occupied and lowest unoccupied molecular orbitals (HOMO and LUMO) of organic semiconductors are analogous to the valence and conduction bands of inorganic semiconductors. During operation of the OLED 42, a voltage 40 is applied across the electrodes 32 and 24 of the OLED 42 such that the anode is positive with respect to the cathode.

Anodes are picked based upon the quality of their optical transparency, electrical conductivity, and chemical stability. A current of electrons flows through the device from cathode to anode, as electrons are injected into the LUMO of the organic layer at the cathode and withdrawn from the HOMO at the anode (e.g., the injection of electron holes into the HOMO). Electrostatic forces bring the electrons and the holes towards each other and they recombine forming an exciton, a bound state of the electron and hole. The decay of this excited state results in a relaxation of the energy levels of the electron, accompanied by emission of radiation whose frequency is in the visible region. The frequency of this radiation depends on the band gap of the material, in this case the difference in energy between the HOMO and LUMO.

Indium tin oxide (ITO) may be employed as the anode material, and is transparent to visible light and has a high work function, which promotes injection of holes into the HOMO level of the organic layer. The conductive layer 24 or 28 may include PEDOT:PSS as the HOMO level of this material generally lies between the work function of ITO and the HOMO of other polymers, reducing the energy barriers for hole injection. Metals such as barium and calcium are often used for the cathode as they have low work functions, which promote injection of electrons into the LUMO of the organic layer. Such metals are reactive, so a capping layer of aluminum may be employed to avoid degradation.

As described, different processing methods may be employed to fabricate OLEDs or other optoelectronic devices. In some embodiments, multiple, tandem or stacked device structures can be made by single transferring or multiple transferring to provide multicolor LED devices in a stacked structure. Further modification of the transferred top layers can improve the light out-coupling, e.g., by increasing purity, increasing smoothness, decreasing thickness, etc. High performance transparent OLEDs or LEDs can be provided in accordance with the present principles by designing the energy band alignment of each material/layer. Optical up-conversion or down-conversion materials can be embedded into the transferred layer or layers to achieve high performance devices.

The properties of the anode (layer 24, 28), specifically the anode to hole transport layer (HTL) 36 interface topography plays a significant role in the efficiency, performance and lifetime of organic light emitting diodes. Imperfections in the surface of the anode decrease anode-organic film interface adhesion, increase electrical resistance, and allow for more frequent formation of non-emissive dark spots in the OLED material. This adversely affects OLED lifetime. By joining the anode 28 with the HTL 36 using a wafer transfer process, damage at this interface is kept to a minimum or is eliminated altogether. This greatly improves OLED performance.

Referring to FIG. 10A, an image 102 shows an opaque bottom electrode 104 and a transferred top electrode 106 made in accordance with the present principles. A characteristic curve 112 shows current (A) versus voltage (V) for the device with the transferred electrode on the opaque bottom electrode/substrate 104.

Referring to FIG. 10B, an image 122 shows a transparent bottom electrode 124 and a transferred top electrode 126 made in accordance with the present principles. A characteristic curve 132 shows current (A) versus voltage (V) for the device with the transferred electrode on the transparent bottom electrode/substrate 124.

Figure 11:
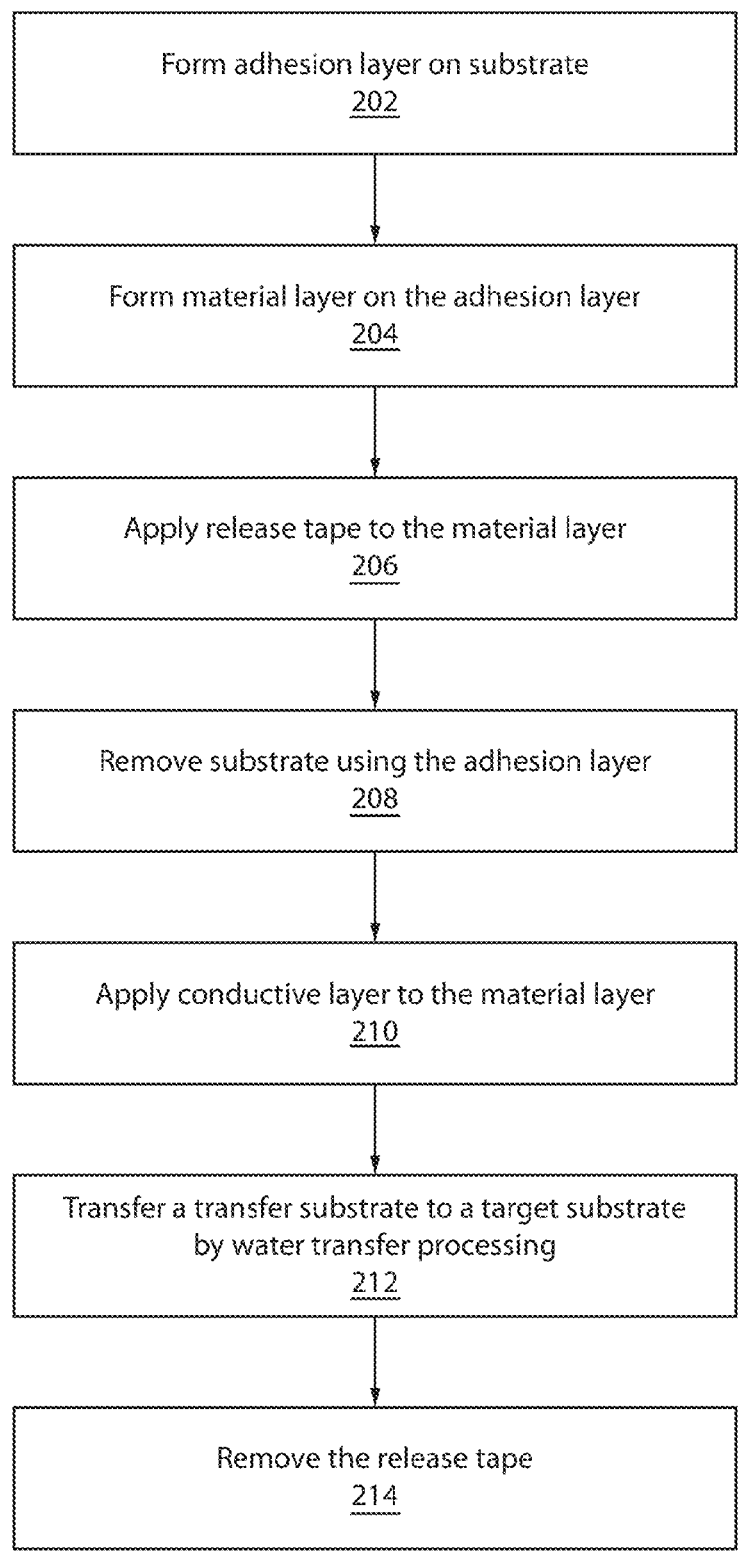
FIG. 11 is a block diagram showing a method for fabrication an optoelectronic device in accordance with the present principles.

Referring to FIG. 11, a method for fabricating a photoelectronic device is shown in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, an adhesion layer is formed on a substrate. The adhesion layer may include forming a layer of one or more of: gold, silver, copper, platinum, graphene, carbon nanotubes, etc. In block 204, a material layer is formed on the adhesion layer. The material layer may include forming one or more of a transparent conductor or a multi-layer structure for forming an electrode of the optoelectronic device. In one embodiment, the material layer and the conductive layer form a top electrode for the optoelectronic device. The optoelectronic device may include an organic light emitting diode.

In block 206, release tape is applied to the material layer. In block 206, the substrate is removed at the adhesion layer by mechanically splitting or yielding the adhesion layer. In block 210, a conductive layer is applied to the material layer on a side opposite the release tape to form a transfer substrate. In one embodiment, the material layer may include a transparent conductor, the conductive layer may include an organic conductor, and the target substrate may include a hole injection layer.

In block 212, the transfer substrate is transferred to a target substrate to join the target substrate to the conductive layer of the transfer substrate. The target substrate includes light emitting layers for the optoelectronic device and the target substrate is preferably formed independently of the transfer substrate. In this way, the sensitive light emitting layers are formed in a separate process from the top electrode layers to avoid damage to the light emitting layers, and the top electrode layers are formed in a separate process from the light emitting layers to prevent damage from the processing of the light emitting layers. An interface between the transfer substrate and the target substrate may be heat bonded or chemically bonded. The interface between the transferred layer and the target substrate may be formed based on molecular bonding, for example, PEDOT:PSS forms a molecular bond with OLED materials.

In block 214, the release tape is removed from the material layer to form a top emission optoelectronic device. Additional steps may be performed to complete the device or devices.

Having described preferred embodiments for an optoelectronics integration by transfer process (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an optoelectronic device, comprising:
   forming an adhesion layer on a substrate;
   forming a material layer on the adhesion layer;
   applying release tape to the material layer;
   removing the substrate at the adhesion layer by mechanically splitting the adhesion layer from the substrate;
   applying a conductive layer to the material layer on a side opposite the release tape to form a transfer substrate, the transfer substrate comprising the release tape, the material layer, and the conductive layer;

transferring the transfer substrate to a target substrate to join the target substrate to the conductive layer of the transfer substrate; and removing the release tape from the material layer to form a top emission surface on the optoelectronic device.

2. The method as recited in claim 1, wherein forming the adhesion layer includes forming a layer of one or more of: gold, silver, copper, platinum, graphene and carbon nanotubes.

3. The method as recited in claim 1, wherein forming the material layer includes forming one or more of: a transparent conductor or a multi-layer structure for forming an electrode of the optoelectronic device.

4. The method as recited in claim 1, wherein the material layer and the conductive layer form a top electrode for the optoelectronic device.

5. The method as recited in claim 1, wherein the optoelectronic device includes an organic light emitting diode.

6. The method as recited in claim 5, wherein the material layer includes a transparent conductor, the conductive layer includes an organic conductor and the target substrate includes a hole injection layer.

7. The method as recited in claim 1, wherein the target substrate includes light emitting layers for the optoelectronic device and the target substrate being formed independently of the transfer substrate.

8. A method for fabricating an optoelectronic device, comprising:

forming an adhesion layer on a substrate;

forming a transparent conductor on the adhesion layer;

applying release tape to the transparent conductor;

removing the substrate at the adhesion layer by mechanically splitting the adhesion layer from the substrate;

applying an organic conductive layer to the transparent conductor on a side opposite the release tape to form a transfer substrate, the transfer substrate comprising the release tape, the transparent conductor, and the organic conductive layer;

forming a target substrate independently of the transfer substrate, the target substrate including light emitting layers and a bottom electrode;

transferring the transfer substrate to the target substrate to join the light emitting layers of the target substrate to the organic conductive layer of the transfer substrate; and removing the release tape from the material layer to form a top emission surface on the organic light emitting diode (OLED).

9. The method as recited in claim 8, wherein forming the adhesion layer includes forming a layer of one or more of: gold, silver, copper, platinum, graphene and carbon nanotubes.

10. The method as recited in claim 8, wherein forming the transparent conductor layer includes forming one or more layers transparent conductive oxide.

11. The method as recited in claim 8, wherein the transparent conductor and the organic conductive layer form a top electrode for the OLED.

12. The method as recited in claim 8, wherein the light emitting layers include an electron injection layer and a hole injection layer formed on the bottom electrode.

* * * * *